United States Patent
Shirota

(10) Patent No.: US 9,349,462 B1
(45) Date of Patent: May 24, 2016

(54) FLASH MEMORY AND PROGRAMMING METHOD THEREOF

(71) Applicant: Winbond Electronics Corp., Taichung (TW)

(72) Inventor: Riichiro Shirota, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/826,204

(22) Filed: Aug. 14, 2015

(30) Foreign Application Priority Data

Dec. 3, 2014 (JP) ................... 2014-244574

(51) Int. Cl.
| | |
|---|---|
| G11C 16/26 | (2006.01) |
| G11C 16/24 | (2006.01) |
| G11C 16/04 | (2006.01) |
| G11C 16/34 | (2006.01) |
| G11C 16/32 | (2006.01) |
| G11C 7/12 | (2006.01) |
| G11C 16/10 | (2006.01) |

(52) U.S. Cl.
CPC ............ *G11C 16/10* (2013.01); *G11C 16/0483* (2013.01); *G11C 16/26* (2013.01); *G11C 16/3459* (2013.01); *G11C 7/12* (2013.01); *G11C 16/32* (2013.01)

(58) Field of Classification Search
CPC .... G11C 16/0483; G11C 16/26; G11C 16/24; G11C 16/10; G11C 7/12; G11C 16/32
USPC ........................ 365/185.17, 185.22, 185.25
See application file for complete search history.

(56) References Cited

U.S. PATENT DOCUMENTS

| | | | | |
|---|---|---|---|---|
| 2003/0214853 A1* | 11/2003 | Hosono | .............. | G11C 16/3454 365/200 |
| 2011/0058427 A1* | 3/2011 | Choi | .................. | G11C 16/0483 365/185.25 |
| 2011/0080791 A1* | 4/2011 | Kim | .................. | G11C 11/5628 365/185.22 |
| 2011/0292725 A1* | 12/2011 | Choi | .................. | G11C 11/5628 365/185.03 |
| 2016/0005472 A1* | 1/2016 | Ahn | ....................... | G11C 16/34 365/185.11 |

FOREIGN PATENT DOCUMENTS

| | | |
|---|---|---|
| JP | 3626221 | 3/2005 |
| JP | 5522682 | 6/2014 |

* cited by examiner

*Primary Examiner* — Ly D Pham
(74) *Attorney, Agent, or Firm* — Jianq Chyun IP Office

(57) ABSTRACT

A programming method of an NAND flash memory is provided, for narrowing a distribution width of a threshold voltage. The method includes a step of verification reading for verifying a threshold voltage of a selected memory cell after a programming voltage is applied to a selected word line. The verification reading further includes a step of pre-charging a voltage to a bit line, a step of discharging the pre-charged bit line to a source line, and a step of reading the voltage of the bit line after the discharging step. Regarding the discharge period from starting the discharging of the bit line to starting the read out, the discharge period of the verification reading after the initial programming voltage is applied is set longer than the discharge period of the verification reading after the subsequent programming voltage is applied.

13 Claims, 11 Drawing Sheets

|  | erase | program | read |
|---|---|---|---|
| selected W/L | 0V | 15~20V | 0V |
| non-selected W/L | F | 10V | 4.5V |
| SGD | F | Vcc | 4.5V |
| SGS | F | 0V | 4.5V |
| SL | F | Vcc | 0V |
| P well | 20V | 0V | 0V |

FIG. 8

FLASH MEMORY AND PROGRAMMING METHOD THEREOF

CROSS-REFERENCE TO RELATED APPLICATION

This application claims the priority benefit of Japan application serial no. 2014-244574, filed on Dec. 3, 2014. The entirety of the above-mentioned patent application is hereby incorporated by reference herein and made a part of this specification.

BACKGROUND OF THE INVENTION

1. Field of the Invention

The invention relates to a non-volatile semiconductor memory device, such as an NAND flash memory, and further relates to a programming verification method.

2. Description of Related Art

An NAND flash memory includes a plurality of NAND strings, and one NAND string includes: a plurality of memory cells connected in series; a source line side selection transistor connected with one end of the memory cell; and a bit line side selection transistor connected with the other end of the memory cell. A control gate of each memory cell is connected with the corresponding word line. A gate of the source line side selection transistor is connected with a selection gate line SGS, and a gate of the bit line side selection transistor is connected with a selection gate line SGD. A plurality of the NAND strings are formed in a P well along a row direction, and one P well constitutes a block of a memory cell array.

The memory cell has an NMOS structure, which includes: a floating gate (charge storage layer) formed to be separated by a tunnel oxide layer; and a control gate formed above the floating gate with a dielectric layer therebetween. When electrons accumulated in the floating gate, a threshold value of the memory cell shifts in the positive direction, and this state is generally called data "0". On the other hand, when the electrons are released from the floating gate, the threshold value shifts to 0 or in the negative direction, and this state is called data "1". FIG. 1 illustrates the distribution widths of the threshold values of the data "0" and "1" of the memory cell, wherein the programming or erasing is controlled by maintaining the threshold value of the memory cell within the distribution width.

In the tunnel oxide layer or the floating gate of the memory cell, errors may occur due to parameter variation of the manufacturing process or time variation. Thus, all the memory cells may not be uniform. That is to say, while some memory cells may be easy to inject electrons, some memory cells may be difficult to inject electrons. Even if these memory cells are applied with the same programming voltage, their threshold values may have different shift amounts. For this reason, the following situation may occur. That is, one memory cell may reach the threshold value distribution width of "0" immediately while another memory cell does not reach the threshold value distribution width of "0" immediately.

To cope with this situation, control is usually performed by programming verification, so as to apply the programming voltage again to the memory cell with insufficient electron injection to make the threshold value of the memory cell fall within the distribution width of "0".

Patent Literature 1 discloses a programming method for narrowing the distribution width of the threshold value of the memory cell and performing high-speed electron injection. As shown in FIG. 2, the programming method divides the programming voltage into a plurality of pulses and thereby applies the programming voltage to the control gate of the memory cell. The initial programming voltage applied to the control gate has a peak value Vpgm, and the peak value of the pulse gradually increases by $\Delta Vpp$. The pulse is a fixed time, and a maximum shift amount $\Delta Vth$ of the threshold value of the memory cell in one electron injection is equal to $\Delta Vpp$. Moreover, Patent Literature 2 discloses a programming method, which divides the programming pulse voltage into a low voltage width portion and a high voltage width portion to suppress the influence of over shoot voltage considering that it is difficult to accurately control the shift amount of the threshold value due to the over shoot of the programming pulse voltage.

PRIOR ART LITERATURE

Patent Literature

Patent Literature 1: Japanese Patent Publication No. 3626221

Patent Literature 2: Japanese Patent Publication No. 5522682

If the programming/erasing are performed repeatedly, memory cells that are programmed fast and memory cells that are programmed slow may be mixed and coexist for reasons such as deterioration of film quality of the tunnel oxide layer, etc. In other words, when applied with the same programming voltage, the threshold value of the memory cell programmed fast has a large shift amount while the threshold value of the memory cell programmed slow has a small shift amount. If the initial verification is performed in such a state, even though the threshold value of the memory cell programmed fast does not reach the target threshold value (verification voltage) yet, the threshold value may appear larger and be determined as qualified.

FIG. 3 is a schematic structural diagram of a memory cell array. FIG. 4 is a diagram showing the voltage waveform of each part during programming verification reading. At the time T1, the bit line is pre-charged. A selection gate line BLS moves to an H level. A bit line selection transistor is turned on. The selection gate line SGD moves to the H level. A bit line side selection transistor is turned on. Regardless of the programming state of the memory cell, the non-selected word line is applied with a pass voltage to turn on the memory cell, the selected word line is applied with a verification voltage, the selection gate line SGS moves to an L level, a source line side selection transistor is turned off, and a gate line BLS of the bit line selection transistor moves to the H level and is turned on. Thus, a pre-charging voltage is applied to the bit lines BLi, BLi+1, BLi+2, and BLi+3 from a page buffer/reading circuit 10.

At the time T2, the bit line is discharged. The selection gate line SGS moves to the H level. The source line side selection transistor is turned on. Moreover, the source line SL is grounded by turning on a transistor Q1. In the following descriptions, the memory cell that programs the data "0" is called the selected memory cell, and the memory cell that retains the data "1" is called the non-selected memory cell.

During the discharging, if the threshold value of the selected memory cell is larger than the verification voltage, the selected memory cell is turned off, and the potential of the bit line is not discharged but remains approximately fixed. On the other hand, if the threshold value of the selected memory cell is below the verification voltage, the selected memory cell is turned on, and the potential of the bit line is reduced by discharging. At the time T3, the potential of the bit line is read by the reading circuit 10, and the potential read by the reading circuit is latched using the time T4.

In FIG. 3, MC1, MC2, and MC3 are selected memory cells; MC4 is a non-selected memory cell; MC2 is set as a memory cell programmed fast; and MC1 and MC3 are set as memory cells programmed slow. Regarding the memory cell MC2 that is programmed fast, by applying the initial programming voltage, relatively more electrons are injected into the floating gate, and the shift amount of the threshold value increases. Regarding the memory cells MC1 and MC3 that are programmed slow, not so many electrons are injected, and the threshold value has a small shift amount. Generally, the number of the memory cells programmed fast that exceed the verification voltage when applied with the initial programming voltage is relatively small. Therefore, in the initial verification when the initial programming voltage is applied, if the memory cell programmed slow is turned on, the current from the bit line is discharged to the source line SL all at once, and the voltage of the source line SL rises about 0.1V-0.2V temporarily due to a resistance R of the source line SL. When the voltage of the source line SL increases, the voltage between the gate/source of the memory cell decreases. At the moment, if the selected memory cell is read, the threshold value of the memory cell programmed fast would appear to be larger.

FIG. 5A shows an example of the threshold value distribution of the initial verification when the initial programming voltage is applied. FIG. 5B shows an example of the threshold value distribution of the verification when the programming voltage ends. As shown in FIG. 5A, when the initial programming voltage is applied, a large portion of the threshold value distribution Vth_s of the selected memory cell is smaller than the verification voltage. On the other hand, if the threshold value of the memory cell programmed fast has a large shift amount and the reading is performed when the voltage of the source line SL is in a floating state, the threshold value distribution Vth_f would appear to be higher than the verification voltage. A positive voltage is applied to the bit line of the selected memory cell that has been verified as having the threshold value Vth_f higher than the verification voltage, so as to inhibit programming when the next programming voltage is applied.

When it is verified that the threshold values of all the selected memory cells are larger than the verification voltage, the verification ends. At the moment, as shown in FIG. 5B, the threshold value Vth_s of the memory cell programmed slow exceeds the verification voltage, but when it is determined that the threshold value Vth_f of the memory cell programmed fast is higher than the verification voltage apparently, the threshold value Vth_f might be lower than the verification voltage. Therefore, if the programming is performed in the state where the memory cells programmed fast and the memory cells programmed slow coexist, the distribution width of the threshold value of the data "0" cannot be narrowed, and because of the low threshold value, the characteristic of retention of the data "0" deteriorates.

SUMMARY OF THE INVENTION

In view of the aforementioned, the invention provides a programming method of an NAND flash memory for narrowing a distribution width of a threshold value.

The invention further provides a programming method of an NAND flash memory for improving a characteristic of data retention.

According to an embodiment, a programming method is for a flash memory that includes a memory array having an NAND string formed by connecting a plurality of memory cells in series. The programming method includes: performing a verification reading to verify whether a threshold value of a selected memory cell is qualified after a programming voltage is applied to a selected bit line, wherein the verification reading includes a pre-charging step of pre-charging a voltage to a bit line, a discharging step of discharging the voltage of the pre-charged bit line to a source line, and a reading step of reading the voltage of the bit line after the discharging step, and wherein a discharge period is from start of the discharging of the bit line to start of the reading, and the discharge period of the verification reading after an initial programming voltage is applied is set longer than the discharge period of the verification reading after a subsequent programming voltage is applied.

According to an embodiment, when the verification reading is performed multiple times, the discharge period is set shorter gradually. According to an embodiment, when the verification reading is performed multiple times, only the discharge period of the verification reading after the initial programming voltage is applied is set longer than the discharge periods of other verification readings. According to an embodiment, the start of the discharging of the bit line is when a source line side selection transistor of the NAND string is turned on. According to an embodiment, the start of the reading is when the bit line is electrically connected with a reading circuit. According to an embodiment, the discharge period is variable corresponding to the number of the member cells programming data "0". According to an embodiment, the discharge period of the verification reading after the initial programming voltage is applied is set at least larger than 6 μs.

According to an embodiment, a flash memory includes: a memory array having NAND strings each formed by connecting a plurality of memory cells in series; a selecting member selecting a word line of the memory array; an applying member applying a programming voltage to the word line selected by the selecting member; and a verification reading member verifying whether a threshold value of a selected memory cell is qualified after the programming voltage is applied, wherein the verification reading member includes: a member applying a verification voltage to the word line selected by the selecting member; a discharging member discharging a voltage of a bit line connected with the selected member cell to a source line when the verification voltage is applied; a detecting member detecting the voltage of the bit line after the discharging of the discharging member; and a setting member setting a discharge period of a verification reading after an initial programming voltage is applied longer than the discharge period of the verification reading after a subsequent programming voltage is applied, wherein the discharge period is from start of the discharging of the bit line performed by the discharging member to start of the detecting performed by the detecting member.

According to an embodiment, the verification reading member includes a pre-charging member pre-charging the bit line, and the discharging member discharges the pre-charged bit line. According to an embodiment, the setting member sets the discharge period shorter gradually when the verification reading is performed multiple times. According to an embodiment, the setting member varies the discharge period corresponding to the number of the member cells programming data "0". According to an embodiment, the discharging member turns on a source line selection transistor of the NAND string to discharge the voltage of the bit line to the source line. According to an embodiment, the detecting member includes a bit line selection transistor connecting the bit line to a reading circuit and starts the detecting when the bit line is electrically connected with the reading circuit via the bit line selection transistor.

Based on the above, the discharge period of starting the reading when performing the verification reading after the initial programming voltage is applied is set longer than the discharge period of starting the reading when performing the verification reading after the subsequent programming voltage is applied, so as to suppress determination of qualification of the selected memory cell during the rise of the voltage of the source line, thereby more accurately verifying the threshold value of the selected memory cell. Thus, even if memory cells with discrepant programming speeds coexist, the distribution width of the threshold value is narrowed and the characteristic of data retention of the memory cell is enhanced.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 8 is a table showing an example of the voltage applied to each part when the flash memory operates.

DESCRIPTION OF THE EMBODIMENTS

Hereinafter, embodiments of the invention are described in detail with reference to the figures. It should be noted that, in order to clearly illustrate the components to facilitate comprehension, the components in the figures may not be drawn to scale.

Figure 6:
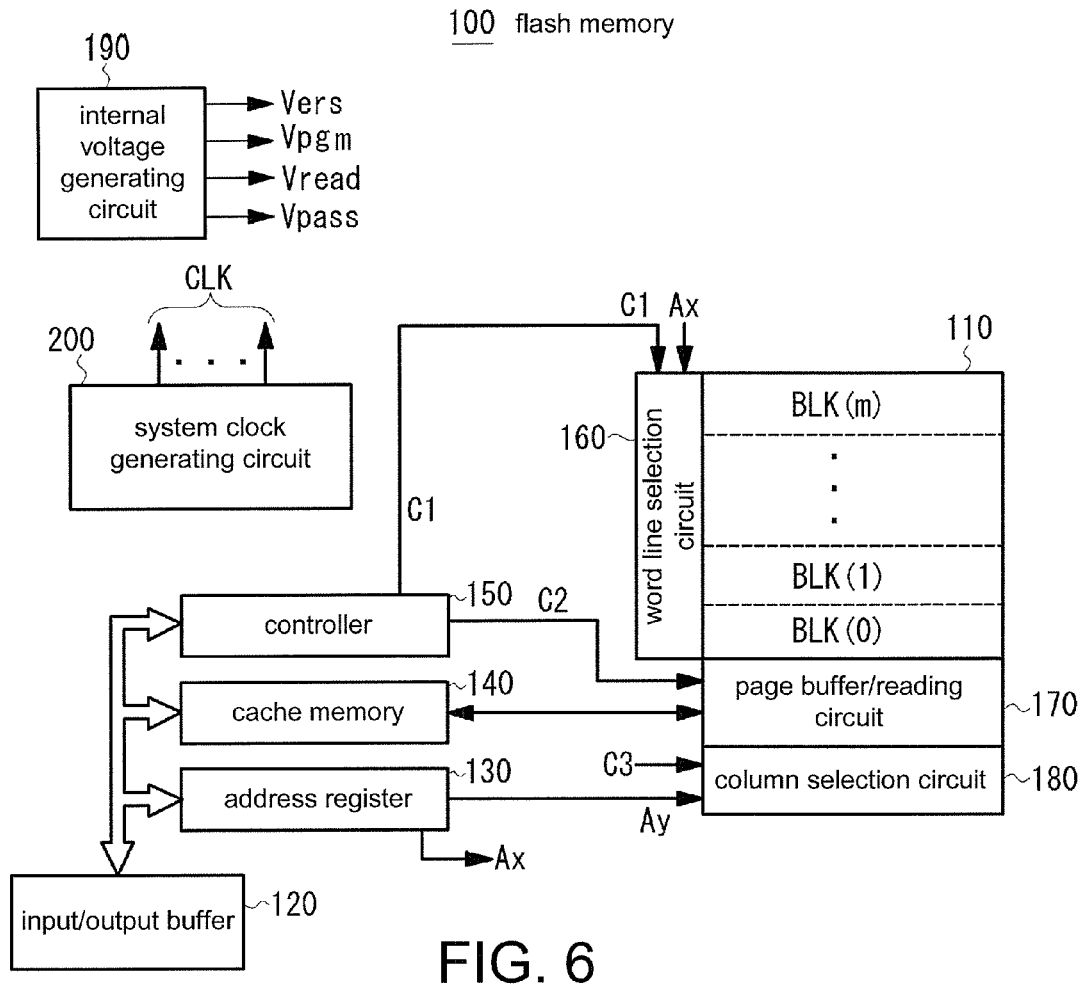
FIG. 6 is a block diagram showing an example of the overall structure of the NAND flash memory according to an embodiment of the invention.

FIG. 6 is a block diagram showing a structural example of an NAND flash memory of this embodiment. With reference to FIG. 6, a flash memory 100 includes: a memory array 110 formed with a plurality of memory cells that are arranged in rows and columns; an input/output buffer 120 connected to an external input/output terminal I/O; an address register 130 receiving address data from the input/output buffer 120; a cache memory 140 retaining data to be inputted or outputted; a controller 150 generating control signals C1, C2, and C3, etc., which control each part based on command data from the input/output buffer 120 and external control signals (e.g. chip enable or address latch enable, etc., not shown); a word line selection circuit 160 decoding column address information Ax from the address register 130 to perform selection of blocks and selection of word lines based on a decoding result; a page buffer/reading circuit 170 retaining data read via a bit line or retaining programming data via the bit line; a column selection circuit 180 decoding row address information Ay from the address register 130 to perform selection of bit lines based on the decoding result; an internal voltage generating circuit 190 generating voltages (e.g. a programming voltage Vpgm, a pass voltage Vpass, a reading voltage Vread, and an erasing voltage Vers (including an erasing pulse, a verification voltage, etc.)) required for reading, programming (writing), and erasing data; and a system clock generating circuit 200 generating an internal system clock CLK.

The memory array 110 includes a plurality of blocks BLK(0), BLK(1), . . . BLK(m) that are arranged in a row direction. The page buffer/reading circuit 170 is disposed at one end of the block. Nevertheless, the page buffer/reading circuit 170 may also be disposed at the other end or at both ends of the block.

Figure 7:
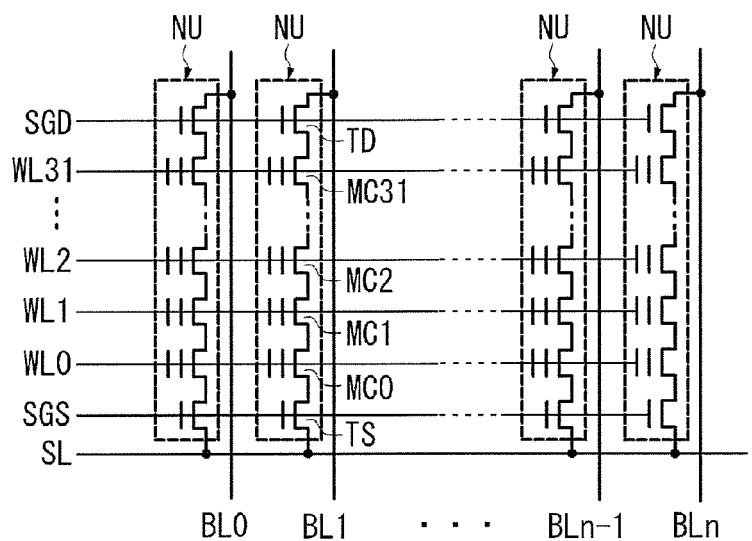
FIG. 7 is an equivalent circuit diagram of an NAND string.

In one block, as shown in FIG. 7, a plurality of NAND string units NU is formed, where each NAND string NU is formed by connecting a plurality of memory cells in series. In one block, n+1 string units NU are arranged in a column direction. The string unit NU includes: a plurality of memory cells MCi (i=0, 1, . . . 31) connected in series; a bit line side selection transistor TD connected with the memory cell MC31 that serves as one end; and a source line side selection transistor TS connected with the memory cell MC0 that serves as the other end, wherein a drain of the bit line side selection transistor TD is connected with one corresponding bit line BL and a source of the source line side selection transistor TS is connected with a common source line SL. A control gate of the memory cell MCi is connected with a word line WLi, a gate of the bit line side selection transistor TD is connected with a selection gate line SGD, and a gate of the source line side selection transistor TS is connected with a selection gate line SGS. When the word line selection circuit 160 selects the blocks based on the column address Ax, the selection transistors TD and TS are selectively driven via the selection gate lines SGS and SGD of the selected block.

Typically, the memory cell has a metal oxide semiconductor (MOS) structure, which includes: source/drain that are N type diffusion region formed in a P well; a tunnel oxide layer formed on a channel between the source/drain; a floating gate (charge storage layer) formed on the tunnel oxide layer; and a control gate formed on the floating gate with a dielectric layer therebetween. When the floating gate stores no charge, i.e. data "1" is written, the threshold value is in a negative state, and the memory cell is turned on by the control gate being 0V. When the floating gate stores electrons, i.e. data "0" is written, the threshold value shifts to be positive, and the memory cell is turned off by the control gate being 0V. However, the memory cell does not necessarily store a single bit and may store multiple bits.

FIG. 8 is a table showing an example of bias voltages that are applied in each operation of the flash memory. In a reading operation, a positive voltage is applied to the bit line; a voltage (e.g. 0V) is applied to the selected word line; a pass voltage Vpass (e.g. 4.5V) is applied to the non-selected word line; a positive voltage (e.g. 4.5V) is applied to the selection gate lines SGD and SGS to turn on the bit line side selection transistor TD and the source line side selection transistor TS; and 0V is applied to the common source line. In a programming operation, a high-voltage programming voltage Vpgm (15V~20V) is applied to the selected word line; a pass voltage (e.g. 10V) is applied to the non-selected word line to turn on the bit line side selection transistor TD and turn off the source line side selection transistor TS; and a potential corresponding to data "0" or "1" is supplied to the bit line. In an erasing operation, a voltage (e.g. 0V) is applied to the selected word line in the block, i.e. the control gate; a high-voltage (e.g. 20V) erasing pulse is applied to the P well; and electrons of the floating gate are extracted to a substrate to use the block as a unit for erasing data.

Figure 9:
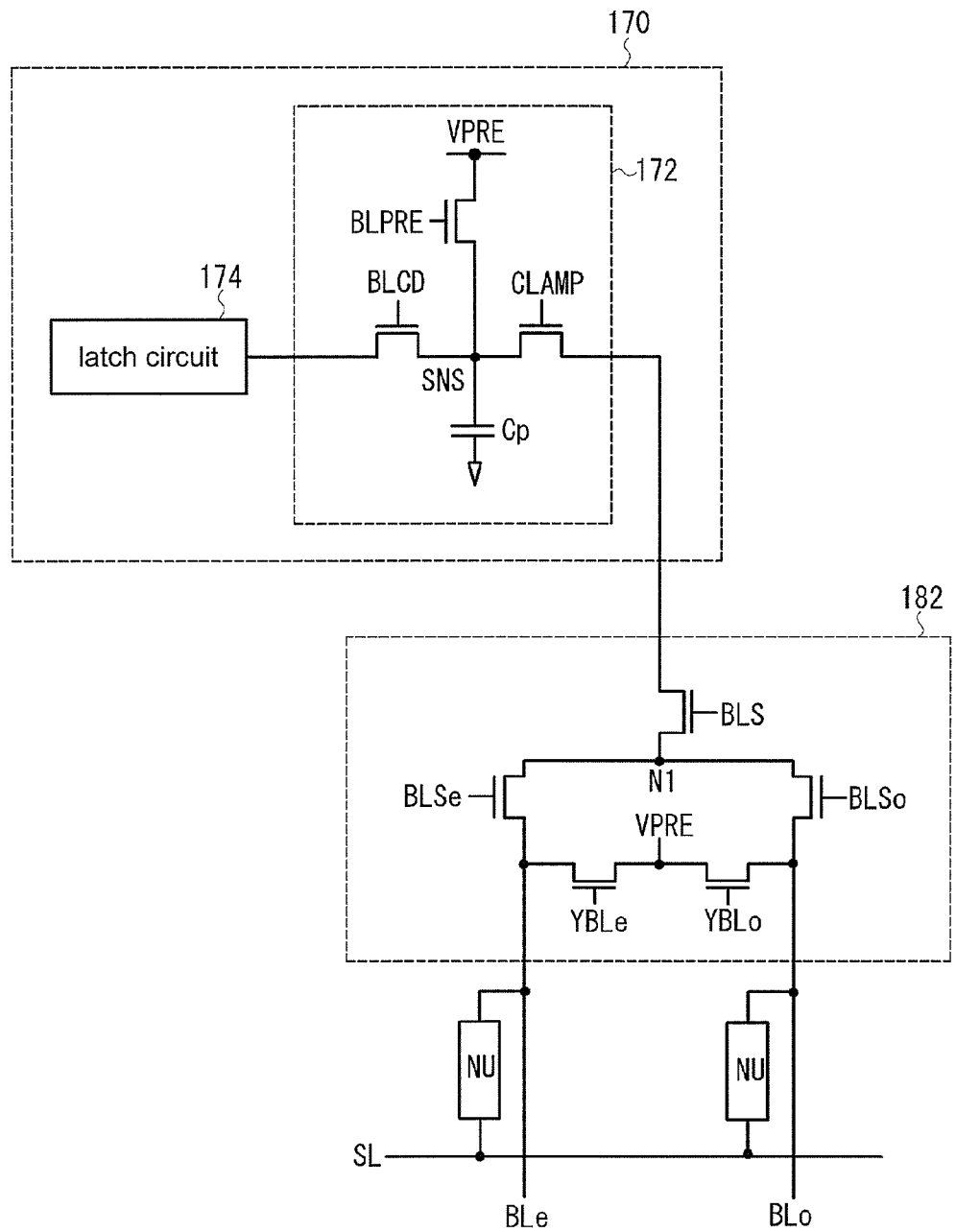
FIG. 9 is a diagram showing an example of the flash memory reading circuit and the bit line selection circuit.

FIG. 9 illustrates an example of a reading circuit and the bit line selection circuit. Here, 1 page including a pair of an even bit line BLe and an odd bit line BLo is exemplified. The page buffer/reading circuit 170 includes a reading circuit 172 and a latch circuit 174 retaining the read data. The reading circuit 172 is connected with the even bit line BLe and the odd bit line BLo via a bit line selection circuit 182. That is, one reading circuit 172 is shared by one pair of even bit line BLe and odd bit line BLo. However, this structure is merely an example. The bit lines may not be divided into the even bit line and the odd bit line, and in that case, the reading circuit is connected with each of the bit lines.

The bit line selection circuit 182 includes: an even bit line selection transistor BLSe selecting the even bit line BLe; an odd bit line selection transistor BLSo selecting the odd bit line BLo; and a bit line selection transistor BLS connected between a common node N1 of the even bit line selection transistor BLSe and the odd bit line selection transistor BLSo and the reading circuit 172. These transistors BLSe, BLSo, and BLS are N type MOS transistors.

A control signal from the controller 150 is applied to the even bit line selection transistor BLSe and the odd bit line selection transistor BLSo and the gate of the bit line selection transistor BLS. These transistors are selectively turned on or off when reading, programming, or erasing is performed. For example, in the reading operation, when the even bit line BLe is selected, the odd bit line BLo is not selected, the even bit line selection transistor BLSe and the bit line selection transistor BLS are turned on, and the odd bit line selection transistor BLSo is turned off. When the odd bit line BLo is selected, the even bit line BLe is not selected, the odd bit line selection transistor BLSo and the bit line selection transistor BLS are turned on, and the even bit line selection transistor BLSe is turned off.

The bit line selection circuit 182 further includes: an even bias transistor YBLe connected between the even bit line BLe and an imaginary power supply VPRE; and an odd bias transistor YBLo connected between the odd bit line BLo and the imaginary power supply VPRE. The even bias transistor YBLe and the odd bias transistor YBLo include N type MOS transistors.

A control signal from the controller 150 is applied to the gates of the even bias transistor YBLe and the odd bias transistor YBLo. These transistors are selectively turned on or off when reading, programming, or erasing is performed. Moreover, the voltage generated by the internal voltage generating circuit 190 can be supplied to the imaginary power supply VPRE through control of the controller 150. For example, during page reading, when the even bit line BLe is selected and the odd bit line BLo is not selected, the even bias transistor YBLe is turned off, the odd bias transistor YBLo is turned on, and a shield potential (GND) is supplied to the odd bit line BLo from the imaginary power supply VPRE. When the even bit line BLe is not selected and the odd bit line BLo is selected, the even bias transistor YBLe is turned on, the odd bias transistor YBLo is turned off, and the shield potential is supplied to the even bit line BLe from the imaginary power supply VPRE. When programming is performed, a programming inhibit voltage is supplied to the imaginary power supply VPRE, and the channel of the memory cell of the non-selected bit line is biased or pre-charged to a writing inhibit voltage.

The reading circuit 172 includes: a clamp transistor CLAMP connected in series to the bit line shared by the even and odd bit lines; a pre-charging transistor BLPRE connected with a reading node SNS; a capacitor Cp connected with the reading node SNS; and a transmission transistor BLCD connected between the reading node SNS and the latch circuit 174. The transistors of the reading circuit 172 are N type MOS transistors. These transistors are selectively turned on or off according to the control signal from the controller 150. When reading is performed, the pre-charging transistor BLPRE is turned on, and the pre-charging voltage supplied from the power supply VPRE charges the selected even or odd bit line via the clamp transistor CLAMP. The reading node SNS maintains a potential of an H level or an L level that is read subsequently. The potential is transmitted to the latch circuit 174 by turning on the transmission transistor BLCD.

Figure 10:
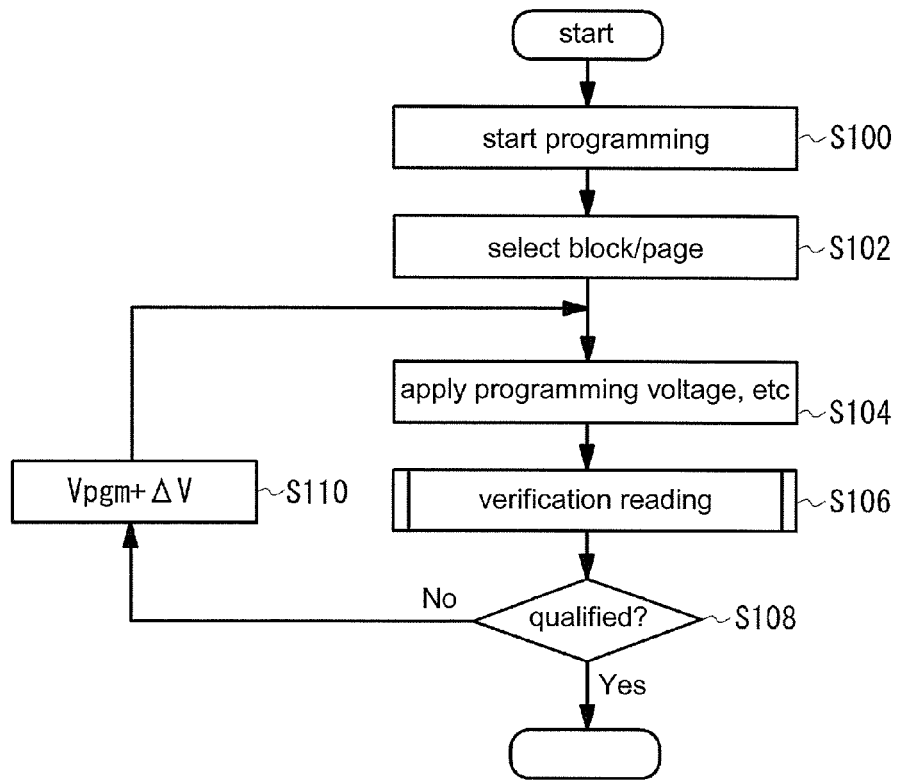
FIG. 10 is a flowchart showing a programming method of an embodiment of the invention.

Hereinafter, a programming method of the flash memory of this embodiment is described. FIG. 10 is a flowchart of the programming method according to this embodiment. First, when the flash memory 100 receives a programming command, programming data, and address information to be programmed from an external host, the controller 150 interprets the programming command and starts a programming sequence (S100). Based on the received address information, the word line selection circuit 160 selects the blocks and pages to be programmed (S102), applies the programming voltage to the selected word line, applies a middle pass voltage to the non-selected word line, applies 0V to the bit line of the selected memory cell, applies a positive voltage to the bit line of the non-selected memory cell, turns on the bit line side selection transistor, turns off the source line side selection transistor, applies Vcc to the source line SL, and applies 0V to the P well (S104).

Figure 1:
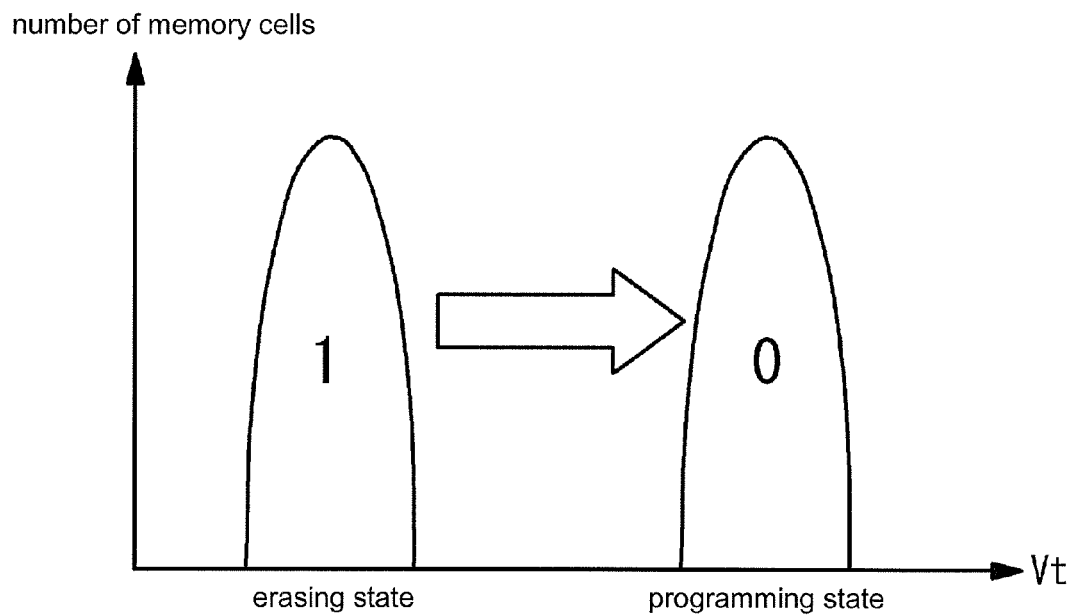
FIG. 1 is a diagram showing the relationship between data "1" and "0" of the NAND flash memory.
Figure 2:
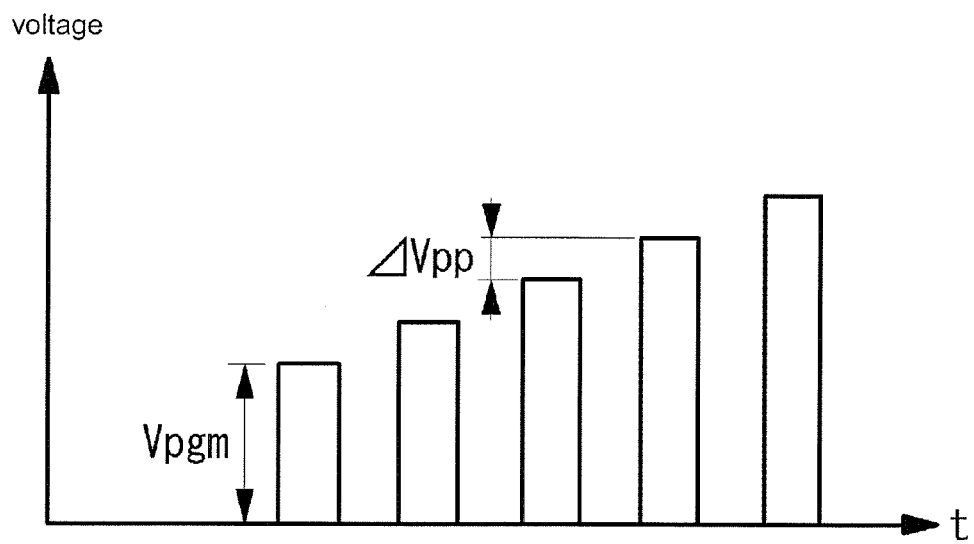
FIG. 2 is a diagram showing an example of the conventional method of applying the programming voltage.
Figure 3:
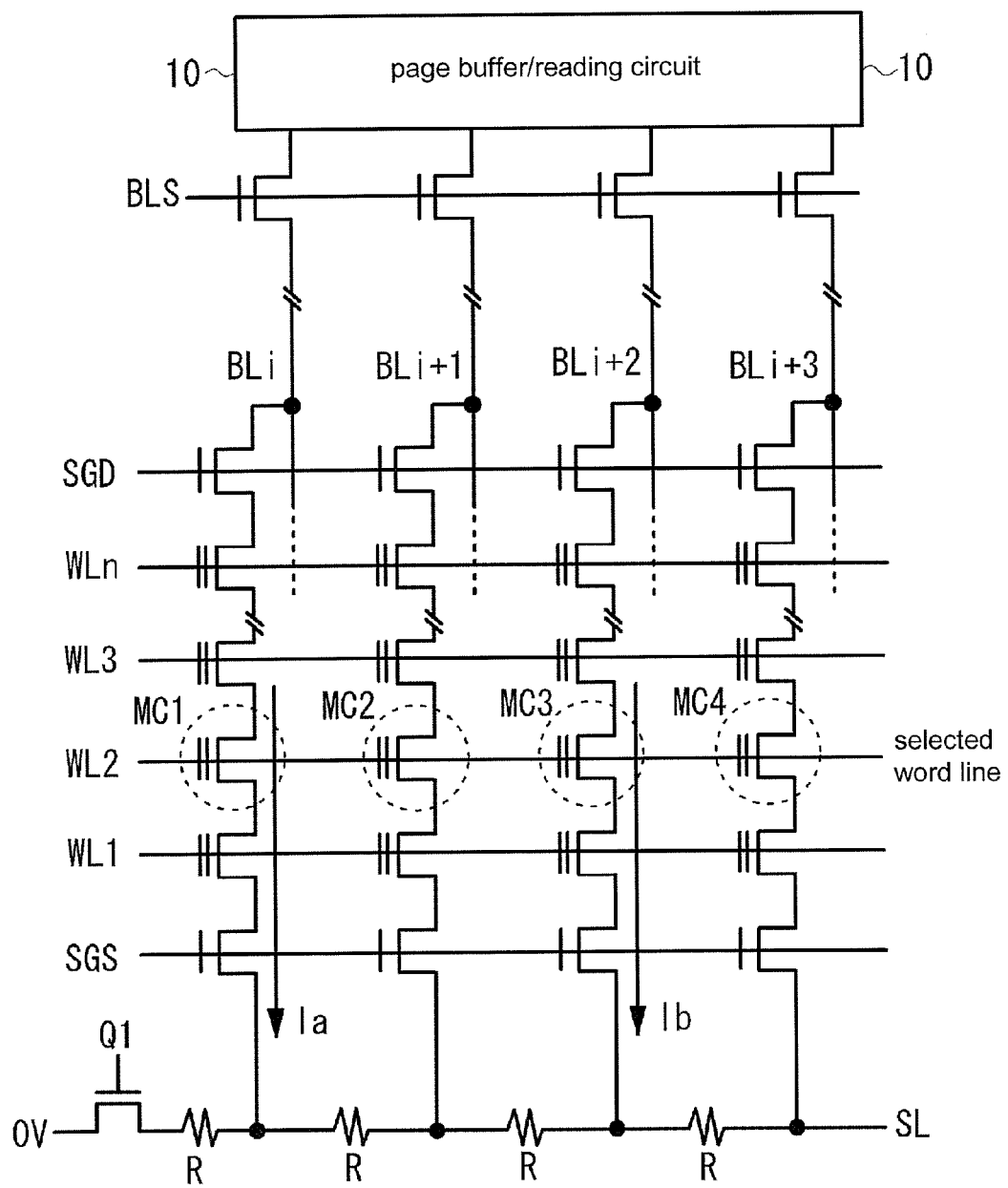
FIG. 3 is a diagram showing verification reading during programming of the NAND flash memory.

Then, verification reading for verifying the threshold value of the selected memory cell is performed (S106). The selected memory cell determined as unqualified in the verification reading is applied with the programming voltage again. At this time, as shown in FIG. 2, an incremental step pulse programming (ISPP) method may be used, which is to apply a programming voltage that the programming voltage Vpgm is ΔV larger than the previous one (S110). On the other hand, a programming inhibit voltage is applied to the bit line of the selected memory cell that is determined as qualified. For such a selected memory cell, in fact no programming voltage is applied. Application of the programming voltage and the verification reading are repeated until the threshold values of all the selected memory cells are determined as qualified.

Figure 11:
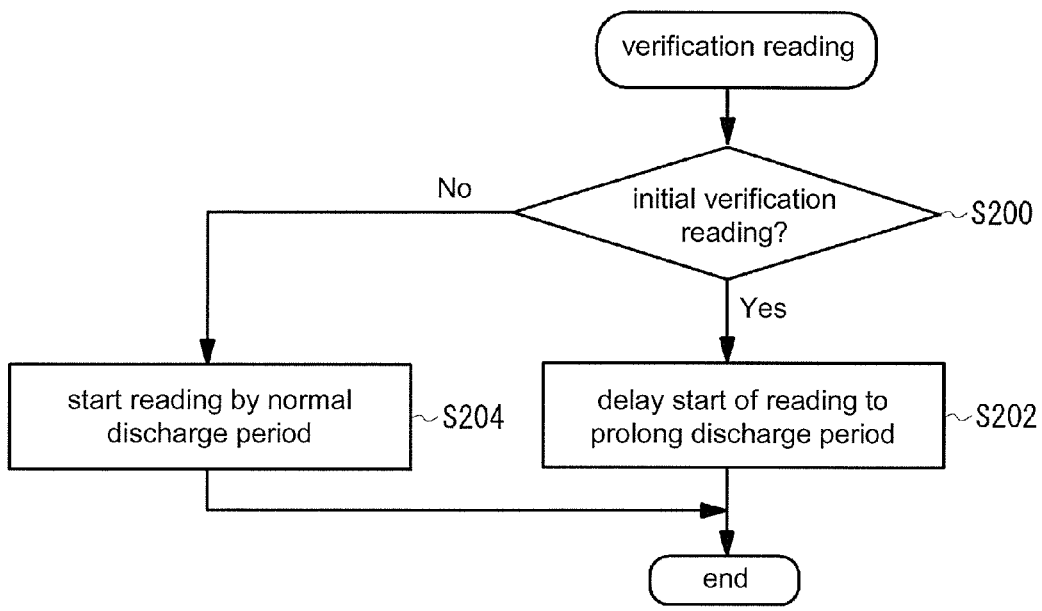
FIG. 11 is a flowchart showing a verification reading operation of an embodiment of the invention.

Hereinafter, the verification reading operation of this embodiment is described. FIG. 11 is a flowchart showing the verification reading of this embodiment. The controller 150 determines whether the verification reading is the initial verification reading, that is, whether the verification reading is the one after application of the initial programming voltage (S200). If the verification reading is determined as the initial verification reading, the controller 150 controls the time of starting the reading to prolong a discharge period of the bit line (S202). On the other hand, if the verification reading is not determined as the initial verification reading, the controller 150 starts the reading with a normal discharge period (S204).

Figure 4:
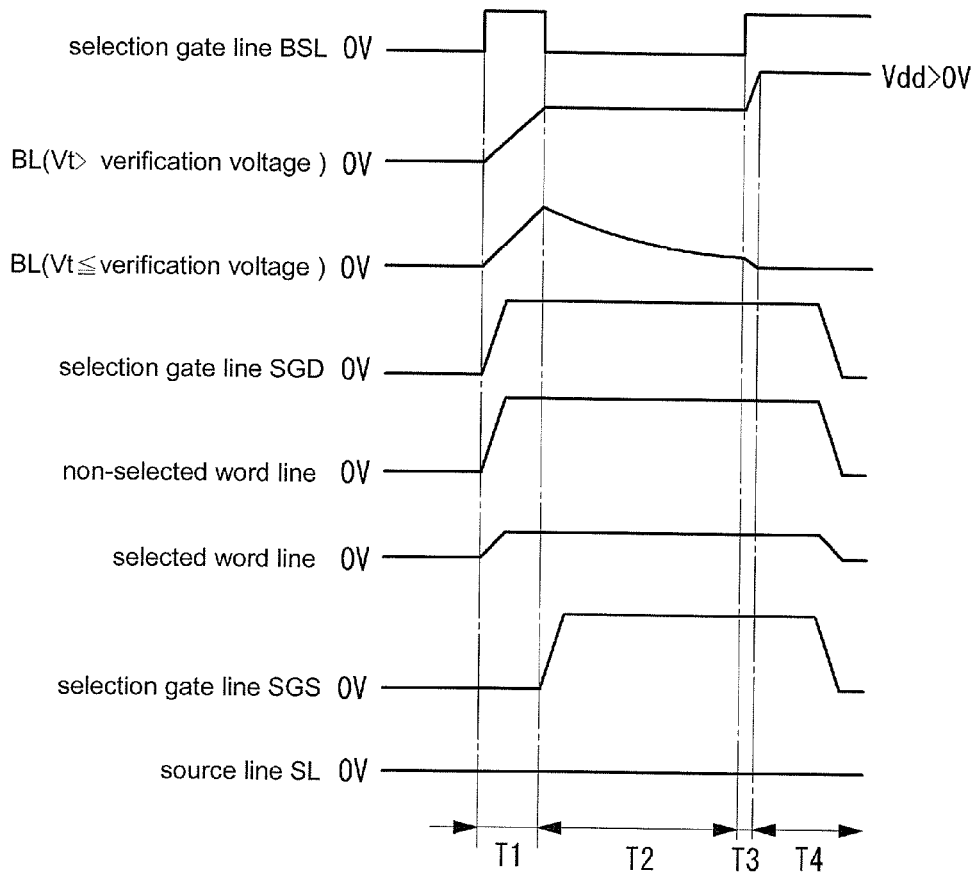
FIG. 4 is a diagram showing the voltage waveform of each part during verification reading.
Figures 5A, 5B:
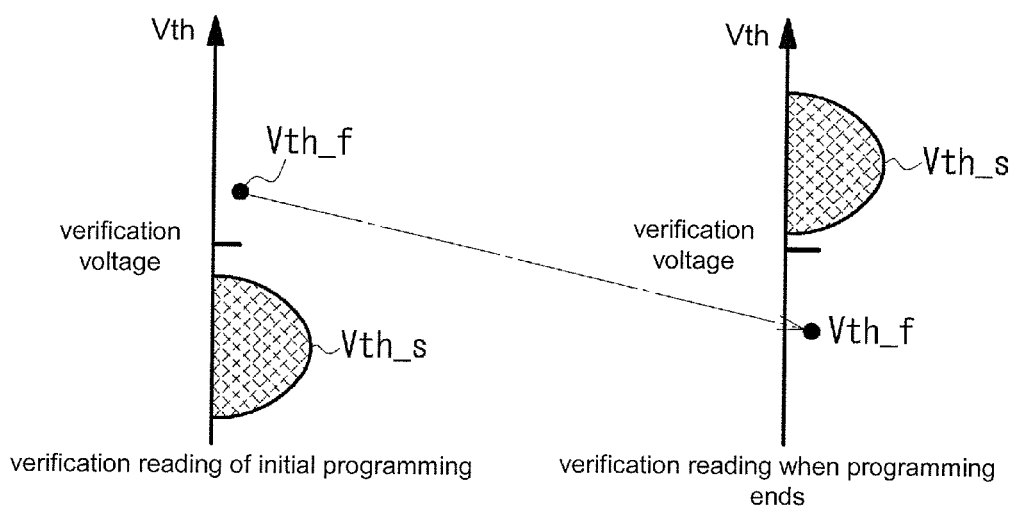
FIG. 5A and FIG. 5B are diagrams showing why the threshold value of the memory cell programmed fast has a wide distribution width.
Figure 12A:
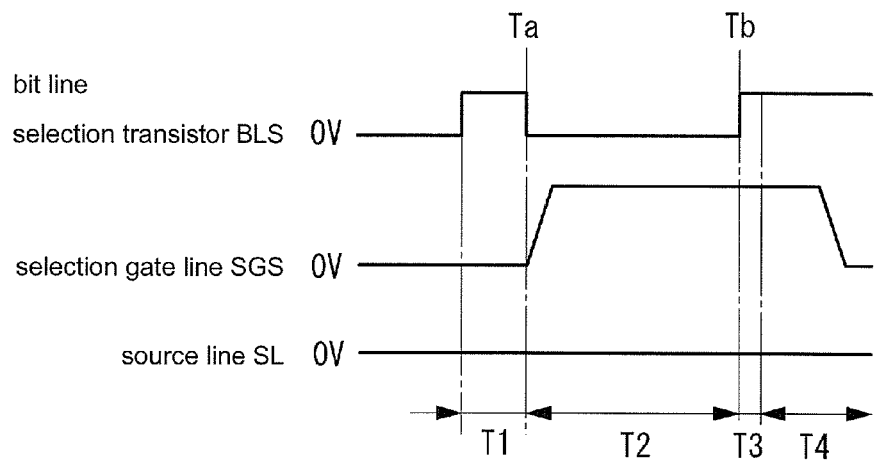
FIG. 12A and FIG. 12B are diagrams showing the voltage waveform of each part during the verification reading according to an embodiment of the invention.
Figure 12B:
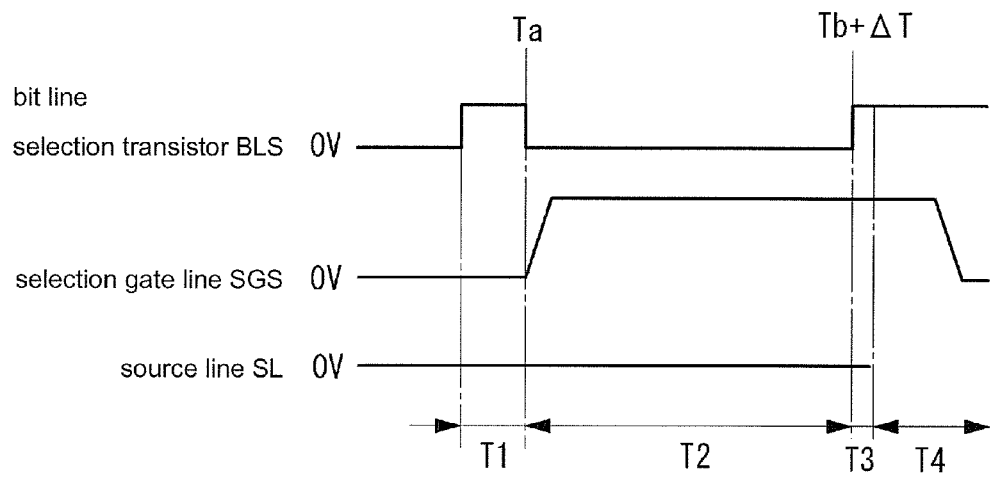

FIG. 12A shows the voltage waveform of each part when the reading operation is performed with the normal discharge period in Step S204, and FIG. 12B shows the voltage waveform of each part when the reading operation is performed with the long discharge period in Step S202. Moreover, FIG. 12A and FIG. 12B only illustrate partial voltage waveforms. The voltage waveforms of the other parts (the selected word line, the non-selected word line, the selection gate line SGD, etc.) may be found in FIG. 4.

In FIG. 12A and FIG. 12B, T1 represents a pre-charge period. In the pre-charge period, the pre-charging transistor BLPRE, the clamp transistor CLAMP, and the bit line selection transistor BLS shown in FIG. 9 are turned on, and the selected bit line (e.g. when the even bit line BLe is selected, the even bit line selection transistor BLSe is turned on) is charged by a positive pre-charging voltage. In addition, the bit line side selection transistor TD of the NAND string is turned on, the source line side selection transistor TS is turned off, the selected word line is applied with a verification voltage, and the non-selected word line is applied with a pass voltage. The source line SL is grounded to GND.

T2 represents the discharge period. The discharge period starts from a time Ta when the bit line can be discharged and ends at a time Tb when the voltage of the bit line can be read. In one mode, the time Ta, i.e. the start of the discharge period, is when the selection gate line SGS is shifted to the H level and the source line side selection transistor TS is turned on. Preferably, the bit line selection transistor BLS is turned off approximately at the same time as the source line side selection transistor TS is turned on or before the source line side selection transistor TS is turned on. Further, in one form, the time Tb, i.e. the end of the discharge period, is when the bit line selection transistor BLS is turned on. However, if the clamp transistor CLAMP is turned on posterior to the bit line selection transistor BLS, the time Tb, i.e. the end of the discharge period, may be when the clamp transistor CLAMP is turned on. During the discharge period, if the threshold value of the selected memory cell is smaller than the verification voltage, the selected memory cell is turned on and the voltage of the bit line is discharged to the source line SL. On the other hand, if the threshold value of the selected memory cell is larger than the verification voltage, the selected memory cell is not turned on and the voltage of the bit line is not discharged to the source line SL, and there is barely any variation in voltage.

T3 represents a reading period. In the reading period, the clamp transistor CLAMP is turned on, and the potential of the bit line is transmitted to the reading node SNS. That is, in the bit line where the selected memory cell is turned on, the reading node SNS becomes a GND level; and in the bit line where the selected memory cell is not turned on, the reading node SNS becomes a precharging voltage level.

T4 represents a latch period. In this period, the transmission transistor BLCD is turned on and the potential of the reading node SNS is retained by the latch circuit 174. The controller 150 determines whether the programming of the selected memory cell is qualified based on the data retained by the latch circuit 174. If unqualified memory cells exist, the controller 150 applies the next programming voltage, applies a positive voltage that inhibits programming to the bit line of the selected memory cell determined as qualified in the verification reading, applies 0V to the bit line of the selected memory cell determined as unqualified, and continues the programming.

Here, as described with reference to FIG. 11, if the verification reading is determined as the initial verification reading after application of the initial programming voltage, the controller 150 delays the end of the discharge period of T2, i.e. the time Tb, than usual. In the normal verification reading, as shown in FIG. 12A, the discharge period T2 is from the time Ta to the time Tb. In contrast thereto, in the initial verification reading, as shown in FIG. 12B, the discharge period T2 is from the time Ta to the time Tb plus $\Delta T$. That is, the discharge period is prolonged by $\Delta T$. As explained below, the reason is to prevent the threshold value of the memory cell of fast programming from increasing apparently.

Figure 13A:
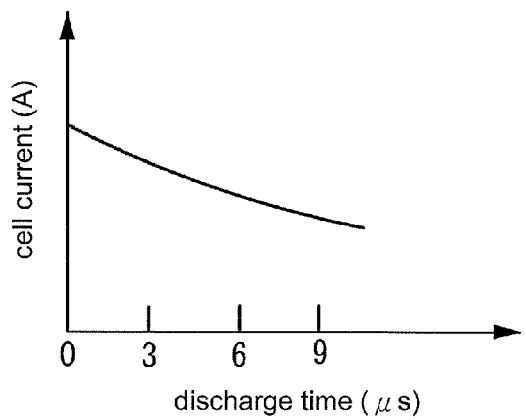
FIG. 13A is a diagram showing the relationship between the discharge time and the cell current when the threshold value of the selected memory cell is sufficiently smaller than the verification voltage.

FIG. 13A shows the relationship between a cell current flowing through the memory cell and the discharge time when the threshold value of the selected memory cell is sufficiently lower than the verification voltage (Vth<<verification voltage). Since the selected memory cell is in the on state, as soon as the source line side selection transistor TS is turned on, a large current instantly flows from the bit line to the source line SL via the selected memory cell, and the cell current decreases gradually as the discharge time passes. That is, in the initial verification reading, if a selected memory cell programmed slow exists, such a large cell current flows from the bit line to the source line SL.

Figure 13B:
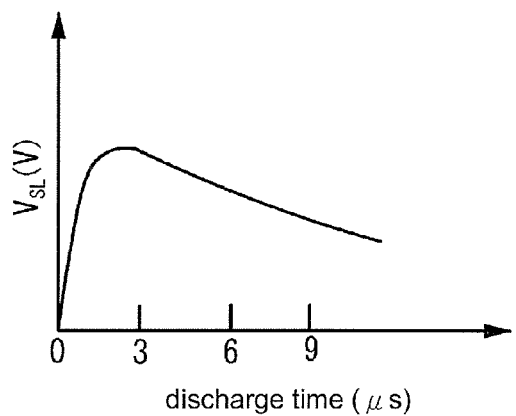
FIG. 13B is a diagram showing the relationship between the discharge time and the voltage of the source line.

FIG. 13B shows the relationship between the discharge time and the voltage $V_{SL}$ of the source line SL. Once the discharge starts, as shown in FIG. 13A, the current flows to the source line SL via the selected memory cell. Thus, the voltage $V_{SL}$ of the source line SL rises steeply immediately after the discharge starts. As the cell current decreases, the voltage $V_{SL}$ of the source line SL decreases gradually.

Figure 13C:
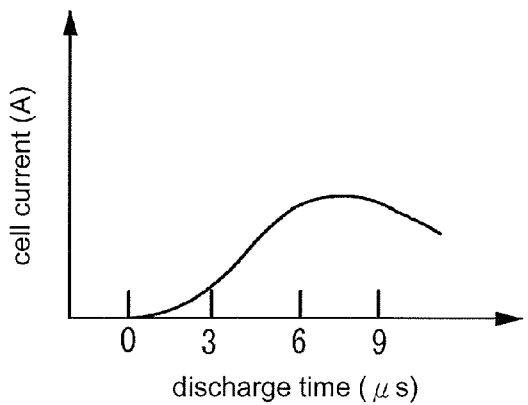
FIG. 13C is a diagram showing the relationship between the discharge time and the cell current.

FIG. 13C shows the relationship between the cell current and the discharge time when the threshold value of the selected memory cell is slightly lower than the verification voltage. In a short period, e.g. 0-3 microseconds, after the discharge starts, the cell current barely flows. Even though the threshold value of the selected memory cell is lower than the verification voltage, in the period right after the discharge starts, because the current that flows to the source line SL all at once, the voltage VSL of the source line SL rises, and the voltage between the gate/source of the selected memory cell becomes smaller than the verification voltage causes. In other words, the threshold value of the selected memory cell exceeds the verification voltage. As a result, the cell current barely flows. If the reading of the bit line starts in this period, the selected memory cell that is programmed fast is still determined as qualified even though the threshold value is lower than the verification voltage. Thereafter, when the discharge time, e.g. 6-9 microseconds, passes, the cell current increases. This is because the current discharged from the bit line to the source line SL via the memory cell decreases, as shown in FIG. 13A. Thus, the voltage $V_{SL}$ of the source line SL drops.

If the voltage of the bit line is read when the voltage VSL of the source line SL drops sufficiently, the adverse influence caused by the cell current flowing through the memory cell programmed slow is prevented. Therefore, the threshold value of the memory cell programmed fast is verified more accurately. Hence, in the initial verification reading of this embodiment, the controller 150 starts the reading after the voltage VSL of the source line SL that rises due to the cell current flowing through the memory cell programmed slow is discharged to a certain extent. That is, the controller 150 controls the time Tb+ΔT of the end of the discharge period as shown in FIG. 12. Take FIG. 13C as an example, the time Tb+ΔT is set to a range of 6 μs-9 μs.

Thus, according to this embodiment, in the initial verification reading after application of the initial programming voltage, the discharge period T2 is set longer than the discharge period of the subsequent verification reading. Thereby, even if memory cells programmed slow and memory cells programmed fast coexist, the threshold value of the memory cell programmed fast is verified accurately. Accordingly, the distribution width of the threshold value of data "0" is narrowed to improve the characteristic of data retention of the memory cell programmed fast. Moreover, in this embodiment, the discharge period of the initial verification reading is prolonged, and the discharge period of the subsequent verification reading is set to the normal discharge period, so as to prevent the following phenomenon. That is, the overall programming time would become very long if the discharge periods of all verification readings are prolonged. When the initial programming voltage is applied, usually, there are more memory cells programmed slow than the memory cells programmed fast. Therefore, when the initial programming voltage is applied, the verification of the threshold value of the memory cells programmed fast may be easily affected by the memory cells programmed slow. Thus, it is more effective to prolong the discharge period of the initial verification reading.

The above embodiment illustrates the example of prolonging the discharge period of the initial verification reading after application of the initial programming voltage, but the invention is not limited thereto. The discharge periods of the initial verification reading and the second verification reading may be set longer than the discharge period of the subsequent verification reading.

Figure 14:
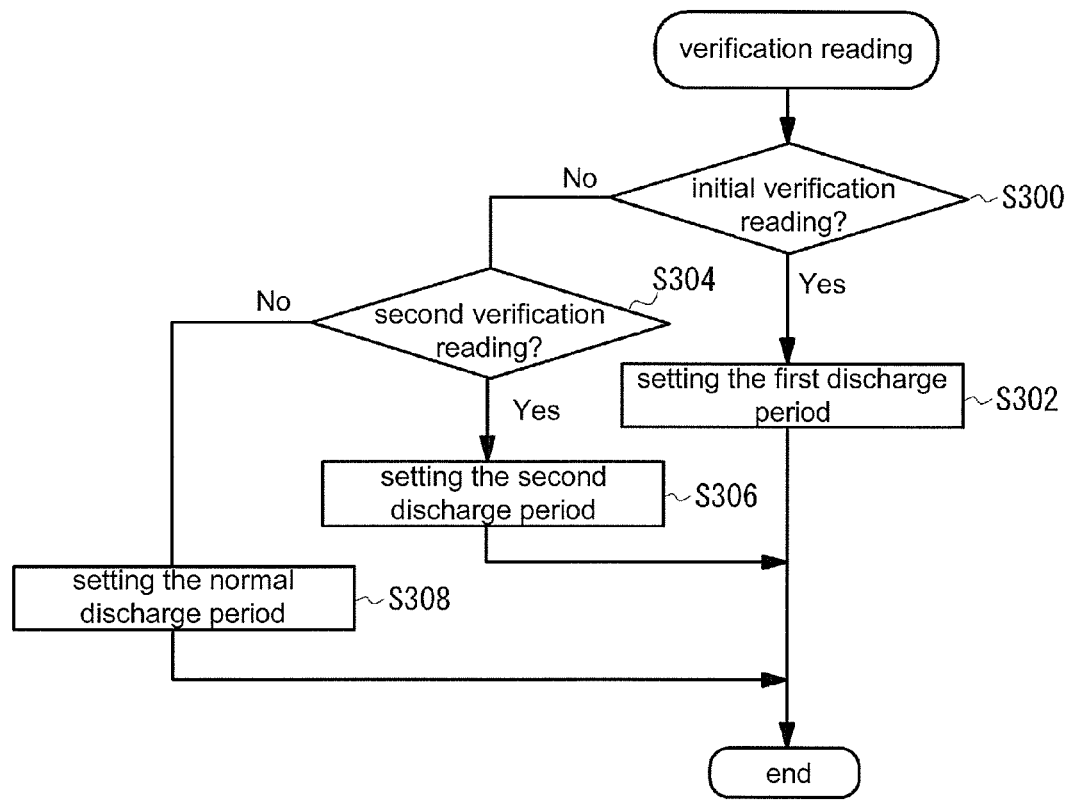
FIG. 14 is a flowchart showing the verification reading operation of the second embodiment of the invention.

Next, the second embodiment of the invention is described below. FIG. 14 is a flowchart showing the verification reading operation of the second embodiment. The controller 150 determines whether the verification reading is the initial verification reading (S300) and sets a first discharge period (S302) if the verification reading is the initial verification reading. If the verification reading is not the initial verification reading, the controller 150 determines whether the verification reading is the second verification reading (S304) and sets a second discharge period (S306) if the verification reading is the second verification reading. If the verification reading is not the second verification reading, the normal discharge period is set. Here, the following relation exists, that is, the first discharge period>the second discharge period>the normal discharge period.

As compared to the first verification reading, in the second verification reading, the number of the selected memory cells with the threshold value smaller than the verification voltage is expected to reduce, and correspondingly, the rise of the voltage VSL of the source line SL decreases as well. Therefore, by slightly shortening the discharge period according to the rise of the voltage VSL, the threshold value of the memory cell programmed fast is accurately verified and the programming time is shortened. In the above embodiment, the first verification reading and the second verification reading are determined, but the invention is not limited thereto. A third verification reading and a fourth verification reading may also be verified, and a third discharge period and a fourth discharge period corresponding thereto may be set (the second discharge period>the third discharge period>the fourth discharge period>the normal discharge period).

Figure 15:
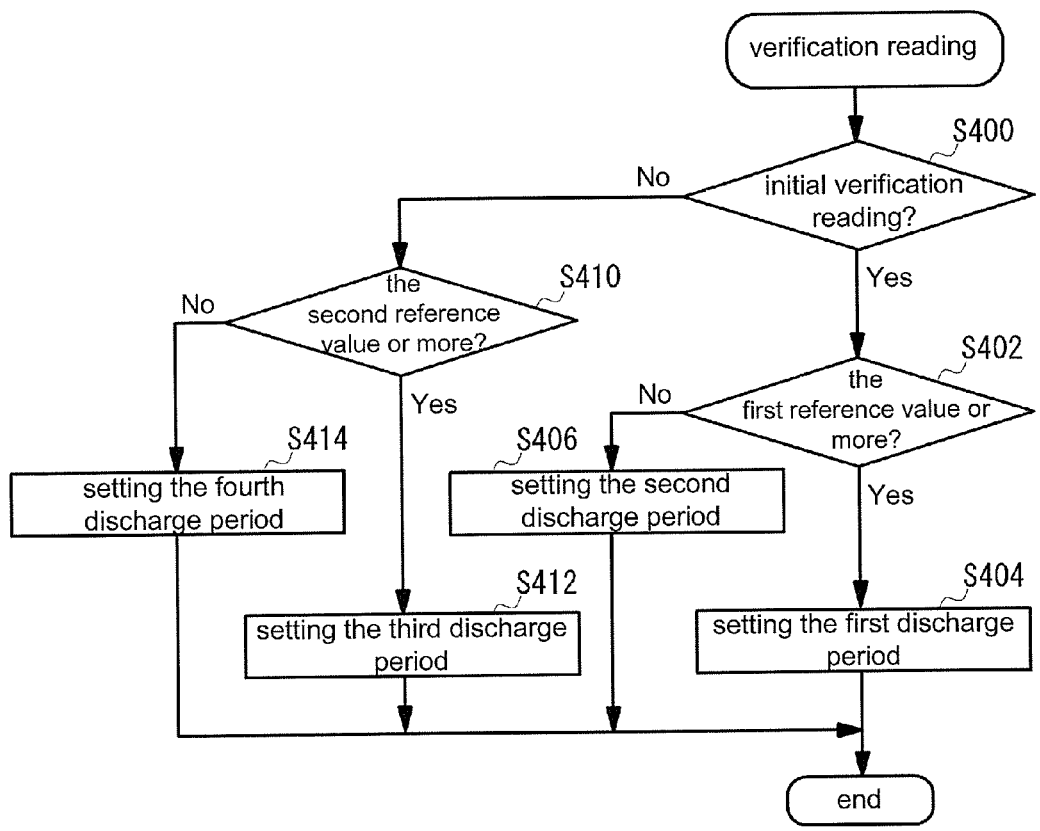
FIG. 15 is a flowchart showing the verification reading operation of the third embodiment of the invention.

Next, the third embodiment of the invention is described below. FIG. 15 is a flowchart showing the verification reading operation of the third embodiment. Same as the first embodiment, the controller 150 determines whether the verification reading is the initial verification reading (S400). If the verification reading is the initial verification reading, then whether the number of the memory cells that program the data "0" is equal to or larger than a first reference value is determined with reference to programming data (S402), wherein the first discharge period is set if the number is equal to or larger than the first reference value (S404); and the second discharge period is set if the number is smaller than the first reference value (S406). On the other hand, if the verification reading is not the initial verification reading, whether the number of the memory cells that program the data "0" is equal to or larger than a second reference value is determined (S410), wherein the third discharge period is set if the number is equal to or larger than the second reference value (S412); and the fourth discharge period is set if the number is smaller than the second reference value (S414). Here, the following relation exists, that is, the first discharge period>the second discharge period>the third discharge period>the fourth discharge period>the normal discharge period.

Thus, according to this embodiment, by setting the discharge period according to the number of the memory cells of the data "0" that causes influence to the rise of the voltage VSL of the source line SL, the threshold value of the memory cells programmed fast is verified accurately and the programming time is shortened.

Exemplary embodiments of the invention are disclosed as above, but it should be noted that various modifications or alterations can be made to the disclosed embodiments without departing from the scope or spirit of the invention, as defined in the following claims. It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A programming method of a flash memory that comprises a memory array having an NAND string formed by connecting a plurality of memory cells in series, the programming method comprising:

performing a verification reading to verify whether a threshold value of a selected memory cell is qualified after a programming voltage is applied to a selected word line, wherein the verification reading comprises a pre-charging step of pre-charging a voltage to a bit line, a discharging step of discharging the voltage of the pre-charged bit line to a source line, and a reading step of reading the voltage of the bit line after the discharging step, and wherein a discharge period is from start of the discharging of the bit line to start of the reading, and the discharge period of the verification reading after an initial programming voltage is applied is set longer than the discharge period of the verification reading after a subsequent programming voltage is applied.

2. The programming method according to claim 1, wherein when the verification reading is performed multiple times, the discharge period is set shorter gradually.

3. The programming method according to claim 1, wherein when the verification reading is performed multiple times, only the discharge period of the verification reading after the initial programming voltage is applied is set longer than the discharge periods of other verification readings.

4. The programming method according to claim 1, wherein the start of the discharging of the bit line is when a source line side selection transistor of the NAND string is turned on.

5. The programming method according to claim 1, wherein the start of the reading is when the bit line is electrically connected with a reading circuit.

6. The programming method according to claim 1, wherein the discharge period is variable corresponding to the number of the member cells programming data "0".

7. The programming method according to claim 1, wherein the discharge period of the verification reading after the initial programming voltage is applied is set at least larger than 6 µs.

8. A flash memory, comprising:
a memory array, having NAND strings each formed by connecting a plurality of memory cells in series;
a selecting member, selecting a word line of the memory array;
an applying member, applying a programming voltage to the word line selected by the selecting member; and
a verification reading member, verifying whether a threshold value of a selected memory cell is qualified after the programming voltage is applied,
wherein the verification reading member comprises: a member applying a verification voltage to the word line selected by the selecting member; a discharging member discharging a voltage of a bit line connected with the selected member cell to a source line when the verification voltage is applied; a detecting member detecting the voltage of the bit line after the discharging of the discharging member; and a setting member setting a discharge period of a verification reading after an initial programming voltage is applied longer than the discharge period of the verification reading after a subsequent programming voltage is applied, wherein the discharge period is from start of the discharging of the bit line performed by the discharging member to start of the detecting performed by the detecting member.

9. The flash memory according to claim 8, wherein the verification reading member comprises a pre-charging member pre-charging the bit line, and the discharging member discharges the pre-charged bit line.

10. The flash memory according to claim 8, wherein the setting member sets the discharge period shorter gradually when the verification reading is performed multiple times.

11. The flash memory according to claim 8, wherein the discharge period is variable corresponding to the number of the member cells programming data "0".

12. The flash memory according to claim 6, wherein the discharging member turns on a source line selection transistor of the NAND string to discharge the voltage of the bit line to the source line.

13. The flash memory according to claim 8, wherein the detecting member comprises a bit line selection transistor connecting the bit line to a reading circuit and starts the detecting when the bit line is electrically connected with the reading circuit via the bit line selection transistor.

* * * * *